US010024924B2

(12) United States Patent
Imaizumi

(10) Patent No.: US 10,024,924 B2
(45) Date of Patent: Jul. 17, 2018

(54) REMAINING BATTERY LIFE PREDICTION DEVICE AND BATTERY PACK

(71) Applicant: SII Semiconductor Corporation, Chiba-shi, Chiba (JP)

(72) Inventor: Eiki Imaizumi, Chiba (JP)

(73) Assignee: ABLIC INC., Chiba (JP)

(*) Notice: Subject to any disclaimer, the term of this patent is extended or adjusted under 35 U.S.C. 154(b) by 181 days.

(21) Appl. No.: 15/059,944

(22) Filed: Mar. 3, 2016

(65) Prior Publication Data
US 2016/0266211 A1   Sep. 15, 2016

(30) Foreign Application Priority Data

Mar. 13, 2015 (JP) ................................. 2015-051309

(51) Int. Cl.
*H01M 10/46* (2006.01)
*G01R 31/36* (2006.01)

(52) U.S. Cl.
CPC ..... *G01R 31/3662* (2013.01); *G01R 31/3624* (2013.01); *G01R 31/3679* (2013.01); *G01R 31/3651* (2013.01)

(58) Field of Classification Search
CPC ................................ H02J 7/0021; H02J 7/0026
USPC ........ 324/426, 430, 433; 320/106, 107, 132, 320/149, DIG. 18, DIG. 21; 702/63, 64
See application file for complete search history.

(56) References Cited

U.S. PATENT DOCUMENTS

| | | | |
|---|---|---|---|
| 5,767,659 A * | 6/1998 | Farley | H01M 10/46 320/106 |
| 6,789,025 B2 * | 9/2004 | Boerhout | G01H 1/003 702/35 |
| 6,789,026 B2 | 9/2004 | Barsoukov et al. | |
| 2014/0356695 A1 * | 12/2014 | Abe | H01M 4/131 320/134 |
| 2015/0331057 A1 * | 11/2015 | Imaizumi | G01R 31/3624 324/427 |

* cited by examiner

*Primary Examiner* — Edward Tso
(74) *Attorney, Agent, or Firm* — Brinks Gilson & Lione

(57) ABSTRACT

Provided is a low-cost battery pack capable of predicting a remaining battery life of a rechargeable battery with more accuracy while being capable of dealing with a variation in battery characteristics. In a remaining battery life prediction device, a constant current source configured to cause a constant current to flow through a battery as a load current is provided, battery voltages before and after the constant current as the load current is caused to flow through the battery are measured at a plurality of time points, and a battery internal resistance is calculated based on a change over time of the battery voltage.

3 Claims, 3 Drawing Sheets

REMAINING BATTERY LIFE PREDICTION DEVICE AND BATTERY PACK

RELATED APPLICATIONS

This application claims priority under 35 U.S.C. § 119 to Japanese Patent Applications No. 2015-051309 filed on Mar. 13, 2015, the entire content of which is hereby incorporated by reference.

BACKGROUND OF THE INVENTION

1. Field of the Invention

The present invention relates to a battery management system, and more particularly, to a remaining battery life prediction device for, for example, a lithium-ion rechargeable battery.

2. Description of the Related Art

It is required for rechargeable batteries that have been used in various devices represented by mobile devices to be provided with a battery management system configured to manage charge and discharge of the battery. An operating time of a device needs to be grasped more accurately particularly when the device is being operated, and a remaining battery life prediction device has been used for accurate detection.

A battery pack including a related-art remaining battery life prediction device is illustrated in FIG. 5. A remaining battery life prediction device 20 includes a CPU 21 configured to perform signal processing calculation, a RAM 22 to be used in the signal processing calculation, an ADC 23 configured to detect a battery voltage obtained by converting, with a level translator 26, a battery voltage of a rechargeable battery 6 per one cell, an ADC 24 configured to detect a voltage generated at a current sensing resistor 10 for detecting a current of the rechargeable battery 6, and a non-volatile memory 25 configured to hold data on, for example, characteristics of a battery in advance. The remaining battery life prediction device 20 is configured to obtain a remaining battery life based on a voltage of the rechargeable battery 6, a transferred charge amount obtained through coulomb counting with a current value of the rechargeable battery 6 measured with the use of the current sensing resistor 10, and the like. In order to predict a remaining life with high accuracy, it is required to measure the voltage and current of the rechargeable battery 6 with high accuracy.

In the related-art remaining battery life prediction device, a battery internal resistance is prepared in advance as a battery internal resistance model, and hence there is a problem in that the related-art remaining battery life prediction device cannot immediately deal with a variation in battery characteristics.

Moreover, in order to determine a voltage corresponding to a voltage drop based on the battery internal resistance, it is necessary to measure a current consumed by the battery, and there has been required a highly-precise current sensing resistor with a large allowable current amount in order to measure the current.

SUMMARY OF THE INVENTION

The present invention provides a low-cost battery pack capable of predicting a remaining battery life of a rechargeable battery with high accuracy.

In order to solve the above-mentioned problems, a remaining battery life prediction device according to one embodiment of the present invention has the following configuration.

The remaining battery life prediction device includes: a first voltage detection unit configured to measure a battery voltage; a current sensing resistor for sensing a load current flowing through a load; a second voltage detection unit configured to measure a voltage of the current sensing resistor; a calculation control unit configured to perform predictive calculation of a remaining battery life based on the battery voltage and the voltage of the current sensing resistor; and a constant current source configured to selectively cause a constant current to flow through the battery as a load. In the remaining battery life prediction device, the calculation control unit is configured to measure the battery voltages before and after the constant current is caused to flow through the battery at at least three time points, and calculate a battery internal resistance based on the measured battery voltages, to thereby predict the remaining life of the battery.

With the above-mentioned configuration, the battery internal resistance can be directly measured, and hence it is possible to provide a low-cost battery pack capable of predicting a remaining battery life of a rechargeable battery with more accuracy while being capable of dealing with a variation in battery characteristics.

DETAILED DESCRIPTION OF THE PREFERRED EMBODIMENTS

Figure 1:
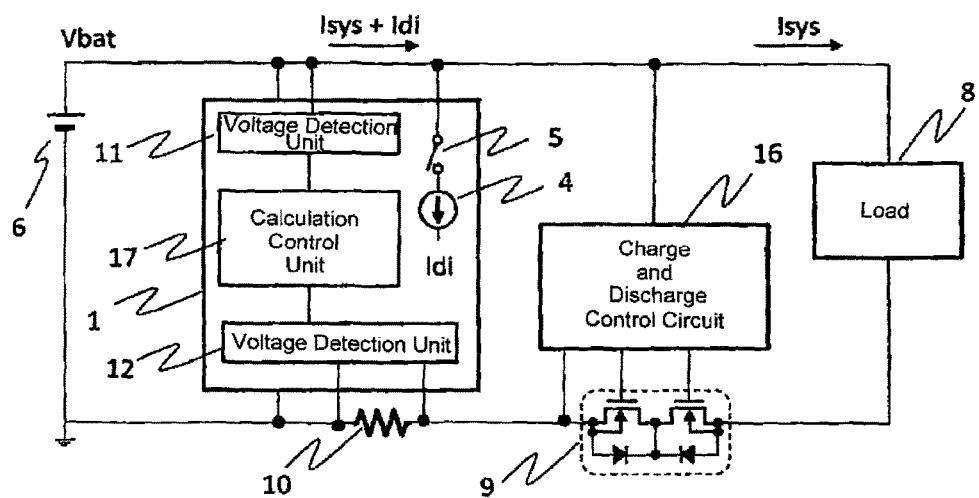
FIG. 1 is a block diagram of a battery pack including a remaining battery life prediction device according to an embodiment of the present invention.

FIG. 1 is a block diagram of a battery pack including a remaining battery life prediction device according to an embodiment of the present invention. The battery pack including the remaining battery life prediction device of this embodiment includes a remaining battery life prediction device 1, a rechargeable battery 6, a MOSFET 9 for charge and discharge control, a current sensing resister 10, and a charge and discharge control circuit 16. The remaining battery life prediction device 1 includes a voltage detection unit 11, a calculation control unit 17, a voltage detection unit 12, a constant current source 4, and a current source control switch 5.

The battery pack of this embodiment has the following connections.

The remaining battery life prediction device 1 is connected to both ends of the rechargeable battery 6. The current sensing resister 10 is connected between a negative terminal of the rechargeable battery 6 and the MOSFET 9. The charge and discharge control circuit 16 is connected to both the ends of the rechargeable battery 6, and has an output terminal connected to the MOSFET 9. An application system serving as a load 8 is connected to external terminals of the device. The voltage detection unit 11 has an input terminal connected to the rechargeable battery 6 and an output terminal connected to the control unit 17. The voltage detection unit 12 has an input terminal connected to both ends of the current sensing resistor 10 and an output terminal connected to the calculation control unit 17. The constant current source 4 and the current source control switch 5 are provided to a positive terminal of the rechargeable battery 6.

The voltage detection unit 11 is configured to measure a battery voltage Vbat of the rechargeable battery 6. The voltage detection unit 12 is configured to detect a voltage across both the ends of the current sensing resistor 10 for measuring a current consumed by the load 8. The calculation control unit 17 is configured to predict a remaining battery life based on the battery voltage Vbat and the consumed current. The constant current source 4 is configured to cause a known constant current for measurement of a battery internal resistance to flow.

Figure 2:
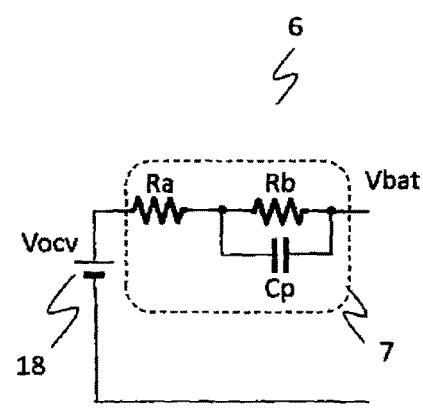
FIG. 2 is a circuit diagram for illustrating an example of an equivalent circuit of a battery.

FIG. 2 is a circuit diagram for illustrating an example of an equivalent circuit of the rechargeable battery 6. The rechargeable battery 6 is assumed to be formed of a voltage source 18 and an internal resistance equivalent circuit model 7. An internal resistance equivalent circuit model of a general rechargeable battery has the following configuration: a circuit including a first resistor and a second resistor connected in series and a capacitor connected in parallel to the second resistor is set as a unit circuit, and a plurality of unit circuits are connected in series. When an attempt is made to approximate a battery internal resistance more accurately through use of an equivalent circuit, the number of stages of unit circuits increases, resulting in complicated calculation. Although the internal resistance equivalent circuit model 7 of the rechargeable battery 6 illustrated in FIG. 2 has a simplified circuit configuration, this configuration is sufficiently suitable for practical use as an internal resistance equivalent circuit model to be used for prediction of a battery remaining life. In this embodiment, a description is given based on the internal resistance equivalent circuit model 7 of the rechargeable battery 6 illustrated in FIG. 2.

When the current consumed by the load 8 is represented by Isys and the current of the constant current source 4 is represented by Idi, changes over time of a battery voltage Vbat(t) and a battery open-circuit voltage Vocv(t) of the rechargeable battery 6 at the time when the current Idi is connected to the rechargeable battery 6 are represented by Expression 1.

$$V\text{bat}(t) = V\text{ocv}(t) - (Ra+Rb) \cdot Isys - Ra \cdot Idi - Rb \cdot Idi (1-e^{-(t-t_0)/\tau}) \quad (1)$$

Note that, Expression 1 assumes a case where the constant current source 4 is connected when time $t=t_0$. In other words, Expression 1 assumes a case where Idi=0 when $t<t_0$, Idi>0 when $t \geq t_0$, and $\tau \equiv Cp \cdot Rb$.

When the time $t<t_0$, the current consumed from the rechargeable battery 6 is the current Isys of the load 8. The battery voltage Vbat in this case is a voltage obtained by subtracting a voltage corresponding to a voltage drop due to the battery internal resistance 7 and the current Isys from the battery open-circuit voltage Vocv. The voltage corresponding to the voltage drop is represented by $-(Ra+Rb)Isys$, and when the battery open-circuit voltage at this time is represented by Vocv(t), the battery voltage Vbat(t) is represented by Expression 2.

$$V\text{bat}(t) = V\text{ocv}(t) - (Ra+Rb) \cdot Isys \quad (2)$$

When the time $t \geq t_0$, a voltage drop due to the current Idi of the constant current source 4 is added, and a drop voltage is represented by Expression 3.

$$-Ra \cdot Idi - Rb \cdot Idi(1-e^{-(t-t_0)/\tau}) \quad (3)$$

When battery voltages immediately before and after the addition of the constant current source 4 are represented by Vbat($t_0-\delta$) and Vbat($t_0+\delta$), respectively, Vbat($t_0-\delta$) and Vbat($t_0+\delta$) are represented as follows.

$$V\text{bat}(t_0-\delta) = V\text{ocv}(t_0-\delta) - (Ra+Rb) \cdot Isys \quad (4)$$

$$V\text{bat}(t_0+\delta) = V\text{ocv}(t_0+\delta) - (Ra+Rb) \cdot Isys - Ra \cdot Idi \quad (5)$$

Considering that a change of the battery open-circuit voltage Vocv is small when a time period immediately after the addition of the constant current source 4 is assumed to be short, a resistance value Ra of the first resistor of the battery internal resistance 7 is represented by Expression 7, and the resistance value Ra can be determined based on a change amount of the battery voltage Vbat and the current Idi of the constant current source 4.

$$Vbtdf\delta \equiv V\text{bat}(t_0+\delta) - V\text{bat}(t_0-\delta) = -Ra \cdot Idi \quad (6)$$

$$Ra = \frac{|Vbtdf\delta|}{Idi} \quad (7)$$

Further, the battery voltages Vbat at two time points of $t=T+to$ and $t=nT+to$ can be represented by Expression 8 and Expression 9, respectively.

$$V\text{bat}(T+to) = V\text{ocv}(T+to) - (Ra+Rb)Isys - Ra \cdot Idi - Rb \cdot Idi(1-e^{-T/\tau}) \quad (8)$$

$$V\text{bat}(nT+to) = V\text{ocv}(nT+to) - (Ra+Rb)Isys - Ra \cdot Idi - Rb \cdot Idi(1-e^{-nT/\tau}) \quad (9)$$

Two variables of the battery internal resistance 7, namely, Rb and Cp, can be determined by analytically solving Expression 8 and Expression 9. In other words, the resistance values Ra and Rb and a capacitance value Cp in the internal resistance equivalent circuit model 7 can be determined by measuring the change over time of the battery voltage Vbat.

Figure 3:
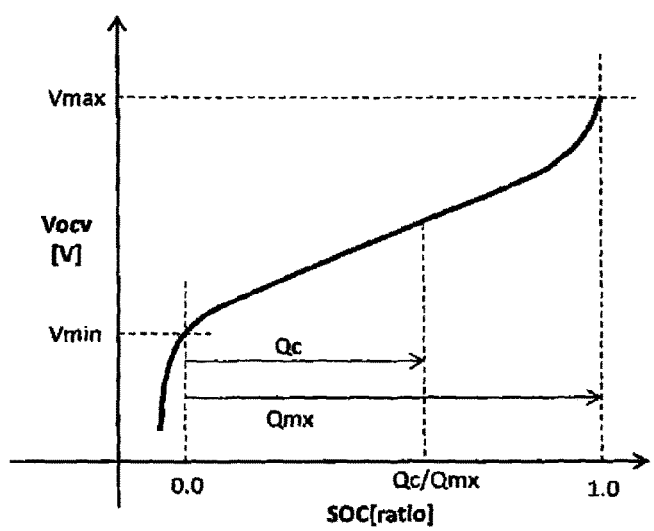
FIG. 3 is a graph for showing an example of dependence between an open-circuit voltage of a rechargeable battery and a state of charge.

Incidentally, in order to determine the battery internal resistance 7 based on the expressions given above, it is necessary to obtain the battery open-circuit voltage Vocv. The battery open-circuit voltage Vocv is strongly correlated with a state of charge SOC of the rechargeable battery 6. FIG. 3 is a graph for showing an example of dependence between the battery open-circuit voltage Vocv and the state of charge SOC. In this case, Vmax represents a maximum voltage at the time of charging of the rechargeable battery 6 and Vmin represents an expected minimum voltage of the rechargeable battery 6, which is defined in advance. Qmx represents an amount of charged electric charges required to fully charge the rechargeable battery 6 from the battery voltage Vmin to the battery voltage Vmax. When an amount of charged electric charges of the rechargeable battery 6 at a given time point is represented by Qc, the state of charge SOC at the given time point is defined by Expression 10.

$$SOC = Qc/Qmx \quad (10)$$

When the state of charge immediately before the constant current Idi is added to the rechargeable battery 6 is represented by Soco, an amount of electric charges Qco charged to the rechargeable battery 6 at this time is represented by Expression 11.

$$Qco = Soco \cdot Qmx \quad (11)$$

When a time period that has passed after the addition of the constant current Idi is represented by n·T (where n is an integer), a change Qcms of the amount of electric charges Qco charged to the rechargeable battery 6 is represented by Expression 12.

$$Qcms = (Isys + Idi)nT \quad (12)$$

The state of charge Soc(n·T) at this time is represented by Expression 13.

$$Soc(nT) = (Qco - Qcms)/Qmx = Soco - nT(Isys + Idi)/Qmx \quad (13)$$

An open-circuit voltage Vocv(n·T) of the rechargeable battery 6 at this time can be determined from the dependence between the battery open-circuit voltage Vocv and the state of charge shown in FIG. 3 based on a value of the state of charge determined from the expressions given above.

Figure 4:
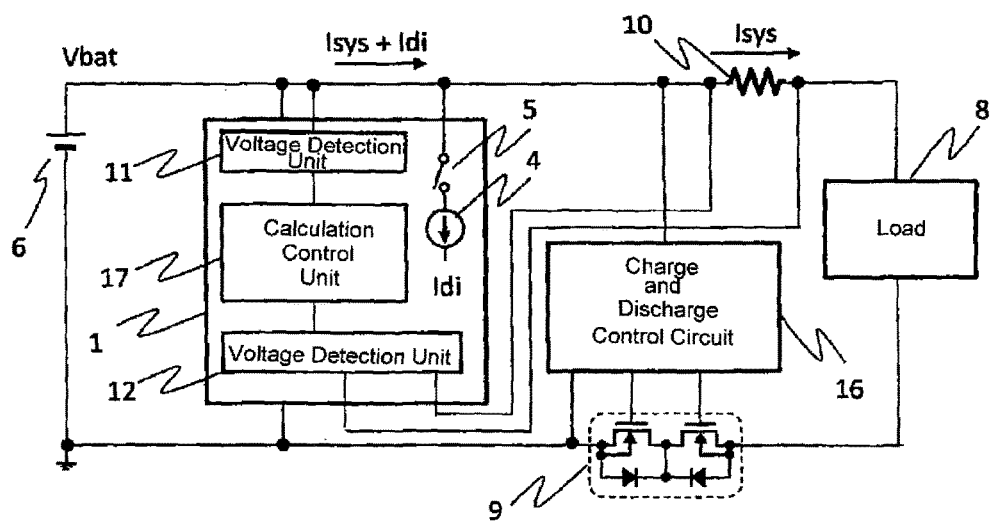
FIG. 4 is another example of a block diagram of the battery pack including the remaining battery life prediction device according to this embodiment.
Figure 5:
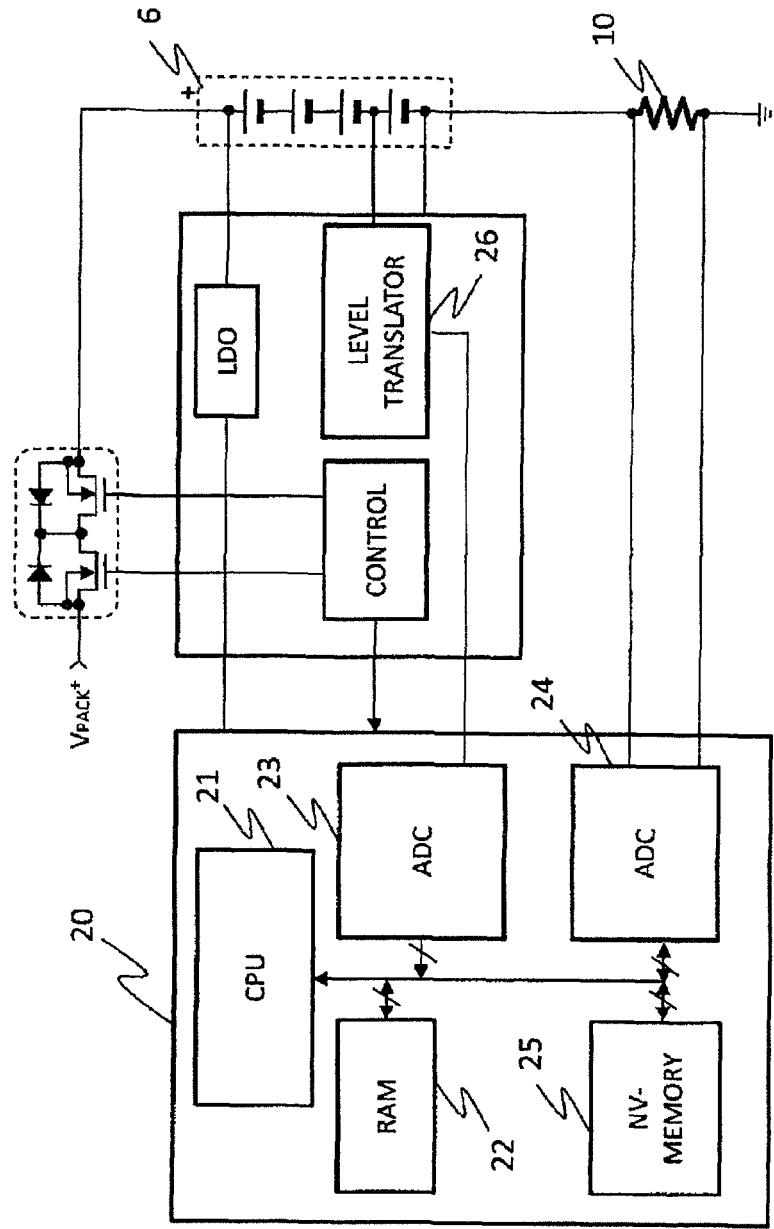
FIG. 5 is a block diagram of a battery pack including a related-art remaining battery life prediction device.

Note that, although an example in which the current sensing resistor 10 is provided on the negative terminal side of the rechargeable battery 6 is described in this embodiment, the same effects can be obtained even when the current sensing resistor 10 is provided on the positive terminal side of the rechargeable battery 6 as illustrated in FIG. 4.

As described above, with the remaining battery life prediction device according to the present invention, it is possible to directly measure the battery internal resistance 7, and it is possible to immediately reflect the actual battery internal resistance 7 in the prediction of a remaining battery life. It is therefore possible to predict a remaining battery life with more accuracy.

Note that, although the voltage detection units are provided individually as the voltage detection units 11 and 12 in the above description, the voltages can be measured with only one voltage detection unit by temporally sharing voltage measurement timing.

Further, although the on/off control of the constant current source 4 is performed by the current source control switch 5 in the above description, it is known that such on/off control can be realized easily by, for example, adding a sleep function to the constant current source 4 itself.

Further, it is to be understood that the current Isys of the load 8 may be Isys=0 instead.

What is claimed is:

1. A remaining battery life prediction device, which is configured to measure a battery voltage of a battery to predict a remaining life of the battery, the remaining battery life prediction device comprising:
   a first voltage detection unit configured to measure the battery voltage;
   a current sensing resistor for sensing a load current flowing through a load;
   a second voltage detection unit configured to measure a voltage of the current sensing resistor;
   a calculation control unit configured to perform predictive calculation of a remaining battery life based on the battery voltage and the voltage of the current sensing resistor; and
   a constant current source configured to selectively cause a constant current to flow through the battery as the load,
   wherein the calculation control unit is configured to measure the battery voltages at three time points or more including once before the constant current is caused to flow through the battery and twice after the constant current is caused to flow through the battery, and calculate a battery internal resistance based on the measured battery voltages, to thereby predict the remaining life of the battery.

2. A remaining battery life prediction device according to claim 1, wherein the first voltage detection unit and the second voltage detection unit are formed through use of one voltage detection unit.

3. A battery pack, comprising:
   a battery and a MOSFET connected in series between a first external terminal and a second external terminal to which a load is connected;
   a charge and discharge control circuit, which is connected to both ends of the battery and is configured to monitor a state of the battery and control the MOSFET; and
   the remaining battery life prediction device of claim 1, which is connected to both the ends of the battery and is configured to predict a remaining life of the battery.

\* \* \* \* \*